US007096397B2

(12) United States Patent
Kundu et al.

(10) Patent No.: US 7,096,397 B2
(45) Date of Patent: *Aug. 22, 2006

(54) DFT TECHNIQUE FOR AVOIDING CONTENTION/CONFLICT IN LOGIC BUILT-IN SELF-TEST

(75) Inventors: Sandip Kundu, Austin, TX (US); Sanjay Sengupta, San Jose, CA (US); Rajesh Galivanche, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 1039 days.

This patent is subject to a terminal disclaimer.

(21) Appl. No.: 09/953,661

(22) Filed: Sep. 17, 2001

(65) Prior Publication Data

US 2003/0053358 A1 Mar. 20, 2003

(51) Int. Cl.
G01R 31/28 (2006.01)
G06F 11/00 (2006.01)
G11C 7/00 (2006.01)

(52) U.S. Cl. .................. 714/732; 702/117; 365/201
(58) Field of Classification Search ............. 714/732, 714/733, 734, 736, 737, 739; 324/763, 765; 702/117, 118, 119, 120; 365/201, 189.07
See application file for complete search history.

(56) References Cited

U.S. PATENT DOCUMENTS

| | | | |
|---|---|---|---|
| 4,433,413 A | 2/1984 | Fasang | 371/25 |
| 4,510,572 A | 4/1985 | Reece et al. | 364/489 |
| 4,628,531 A | 12/1986 | Okamoto et al. | 382/8 |
| 5,001,713 A | 3/1991 | Whetsel | 371/22.3 |
| 5,084,874 A | 1/1992 | Whetsel, Jr. | 371/22.3 |
| 5,103,450 A | 4/1992 | Whetsel | 371/22.1 |
| 5,173,906 A | 12/1992 | Dreibelbis et al. | 371/22.5 |
| 5,369,648 A | 11/1994 | Nelson | 371/27 |
| 5,583,786 A | 12/1996 | Needham | 364/488 |
| 5,617,531 A | 4/1997 | Crouch et al. | 395/183.06 |
| 5,694,402 A | 12/1997 | Butler et al. | 371/22.4 |
| 5,696,771 A | 12/1997 | Beausang et al. | 371/22.3 |
| 5,757,815 A | 5/1998 | Shimogama et al. | 371/21.1 |
| 5,983,377 A | 11/1999 | Knotts | 714/726 |
| 5,987,632 A | 11/1999 | Irrinki et al. | 714/711 |
| 6,041,426 A | 3/2000 | Qureshi | 714/719 |
| 6,046,600 A | 4/2000 | Whetsel | 324/763 |
| 6,067,650 A | 5/2000 | Beausang et al. | 714/726 |
| 6,085,334 A | 7/2000 | Giles et al. | 714/7 |
| 6,510,398 B1 * | 1/2003 | Kundu et al. | 702/117 |

* cited by examiner

*Primary Examiner*—Albert Decady
*Assistant Examiner*—James C. Kerveros
(74) *Attorney, Agent, or Firm*—Schwegman, Lundberg, Woessner & Kluth, P.A.

(57) ABSTRACT

A packaged component includes a pattern generator for generating successive random data patterns. The component further includes a programmable constraint correction module, coupled to the pattern generator, to replace undesirable random data patterns with desirable bit sequences to overcome bus contention problems in the generated random data patterns. The component further includes an integrated circuit device to be functionally tested. The device receives the constrained random data patterns from the constraint correction module and outputs a test result. The device further includes a programmable X-masking module coupled to the device receives and masks the test result by replacing unpredictable bit values in the received test result with predictable bit values. A signature analyzer coupled to the X-masking module receives the masked test result and compresses the test result into a signature. Then a comparator coupled to the signature analyzer compares the signature with a predetermined test result to determine whether the device is free of structural defects.

29 Claims, 3 Drawing Sheets

DFT TECHNIQUE FOR AVOIDING CONTENTION/CONFLICT IN LOGIC BUILT-IN SELF-TEST

TECHNICAL FIELD

This invention relates generally to integrated circuit devices, and more particularly, to testing of semiconductor integrated circuit devices.

BACKGROUND

Testing an integrated circuit device or a packaged component including circuitry (generally referred to as a device under test (DUT)) at the time it is manufactured and before it is incorporated into a next level assembly is generally necessary to ascertain the functionality of the DUT. A microprocessor, for instance, should be tested before it is incorporated into a next level assembly to avoid the cost of discarding the whole assembly, or to avoid a costly diagnosis and repair after it is assembled into the next level assembly.

Traditionally, microprocessors and integrated circuit devices have been subjected to functional testing using an external tester. These external testers contain a large memory that stores test data patterns of ones and zeros used as inputs to the microprocessor along with patterns of correct outputs expected from the microprocessor. The benefits of functional testing include testing the device in the native mode of operation, making speed testing easier, and providing collateral coverage of faults not modeled during the fault grading process. The drawback of functional testing is that the external tester performance has to keep up with microprocessor performance improvements, and the writing of test data patterns for functional testing can take as much as 60 to 100 man-years. Also, functional testing generally increases tester data volume and the application time require to develop the test methodology.

To circumvent the problem of increased tester data volume and application time, a special test mode is designed into the microprocessor circuitry. When this mode of operation is selected, the internal state of nodes in the microprocessor circuitry can be accessed, initialized and controlled directly from the tester without having to run through the functional inputs and outputs that are used in normal operation mode. Using this type of test mode to test the microprocessor accomplishes the testing of the structure of the microprocessor, and not the whole function of the microprocessor. Testing the microprocessor using the special test mode is generally known as "structural testing". Structural testing can considerably reduce the test data volume and application time, and permits using automatic tools to program the tester, which in turn reduces the time required to write test data patterns. However, structural testing targets fault models and not functionality, and are generally small in number.

To overcome this limitation, techniques such as Built-In Self-Test (BIST) have been proposed, which apply a large volume of structural testing to the device. BIST uses random data patterns to test the DUT in the test mode. When using random data patterns in the test mode, the state elements are configured in a long daisy chain, such that the test data moves serially from one state element to another, eventually coming out of an external pin in the DUT. The term "state elements" in this document refers to parts of the microprocessor circuit that potentially hold data for at least one clock cycle. The use of these random data patterns considerably reduces the volume of stored bits on a tester, thereby significantly simplifying and reducing the cost of testing the DUTs.

BIST also uses signature analyzers to compress the test results into a single smaller pattern or "signature", to reduce the amount of tester memory and circuitry required. The signature is then analyzed to determine whether the DUT is free of structural defects. For BIST, the random pattern generator and the signature analyzer circuitry are built into the DUT itself. This eliminates the need for using an external tester to test the DUT.

To apply random data patterns, 0's and 1's are used to energize various parts of circuitry in the DUT. In some cases, however, the application of random data patterns can set up electrically undesirable configurations (undesirable bit segments). For example, applying a non-functional scan test can cause drive fights among multiple drivers sharing a common bus resulting in electrical short circuit from the power supply to ground. This configuration, also referred to as "bus contention", can potentially cause burnout or reliability issues in the DUT. Such configurations are generally ruled out by design in the functional mode, but it is extremely difficult and expensive to guarantee that they will not arise during the application of random data patterns.

Another side effect of using a non-functional testing such as BIST is some of the state elements in the design may be a critical path. Including these state elements in the scan chain can cause a significant delay in a signal propagating through, or serially coming in and out of these state elements, and this may not be acceptable. To circumvent this problem, these state elements may not be scanned, that is, not configured to be part of a serial shift register in test mode. Not scanning a state element results in a loss of control over the value at its output node (a specific kind of state element) during a test, when random data patterns are being shifted into the scanned elements. This can result in a non-deterministic value (unpredictable bit) at the output node of the non-scan state element, which can corrupt the signature being computed in a BIST signature analyzer. This result of a non-deterministic value at the output node is generally referred to as "X-generation".

Generally, for structural testing to succeed, all of the internal state/storage elements must be considered in the scan chain. Leaving some elements out in the test mode can result in lack of controllability and observability. Implementing a pattern correction and X-masking functionality on a structural tester to circumvent the bus contention and the X-generation problems inherent in random patterns generally requires extensive changes to tester architecture and cannot be implemented easily, especially when the current cycle time for new external testers is around 5 to 6 years. Implementing a structural test that can overcome the bus contention and the X-generation problems on a chip generally requires increasing the die size, design effort, and hardware overhead.

Therefore there is a need for a structural test that can be implemented on a chip to circumvent the bus contention problems and the X-generation problems during testing of a DUT, yet can provide the advantages of the random pattern testing such as reduced design overhead, controllability and observability of the DUTs during testing without increasing the die size, design effort, and overhead.

DETAILED DESCRIPTION

Figure 1:
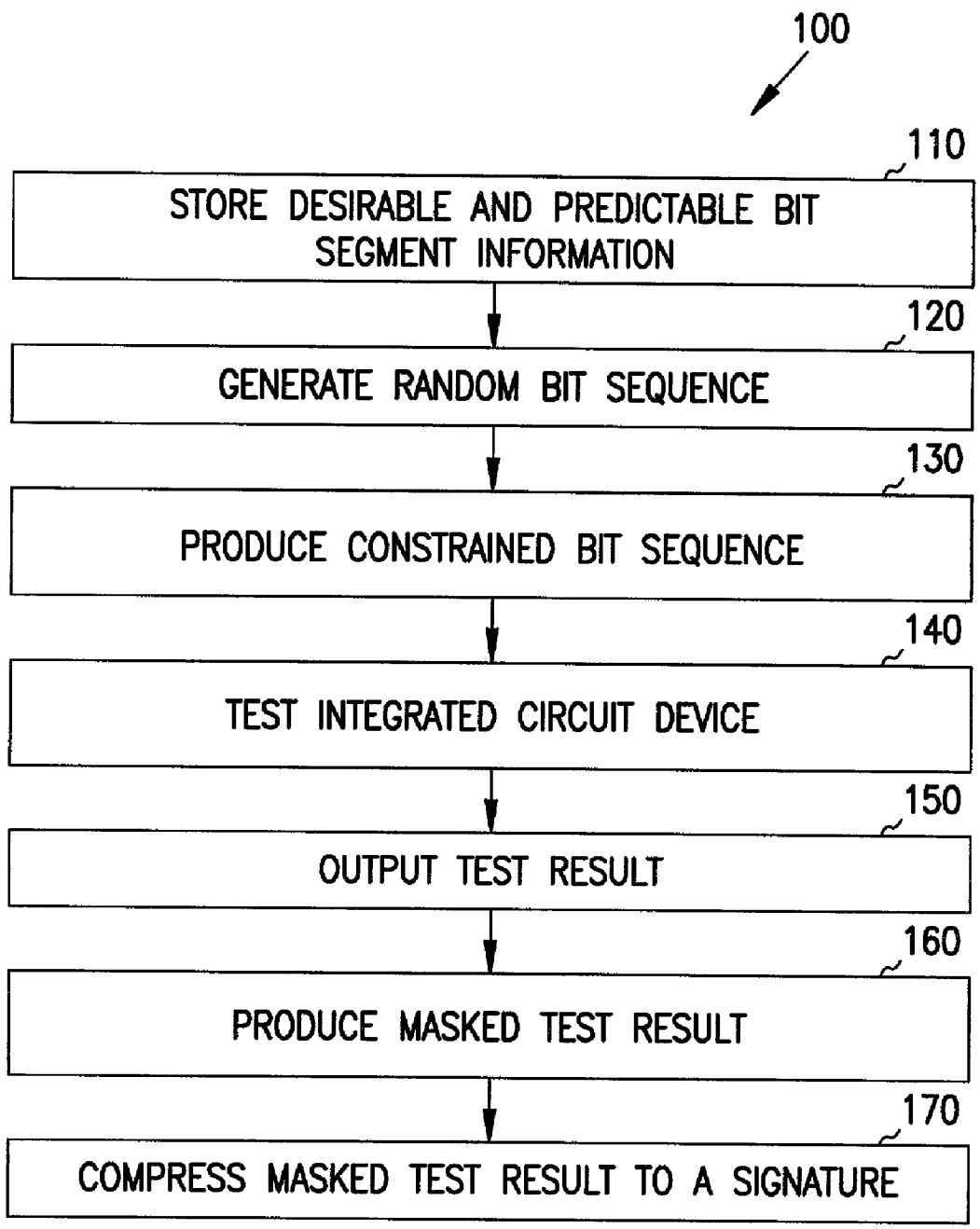
FIG. 1 is a flow diagram of one embodiment the present invention.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The present invention provides a method and apparatus for structurally testing DUTs to avoid the bus contention problems and the X-generation problems generally associated with BIST methodology of testing the integrated circuit devices. For one embodiment, a pattern generator, a programmable constraint correction module, a programmable X masking module, and a signature analyzer are all incorporated into an integrated circuit device to circumvent these problems.

FIG. 1 is an exemplary flow chart 100 of structurally testing an integrated circuit device, also referred to as device under test (DUT) incorporated in a packaged component or a chip. In some embodiments, the integrated circuit device can include a microprocessor having an on-chip cache memory.

Flow chart 100 includes blocks 110–170, which are arranged serially in the exemplary embodiment. However, other embodiments of the invention may execute two or more blocks in parallel using multiple processors or a single processor organized as two or more virtual machines or subprocessors. Moreover, still other embodiments implement the blocks as two or more specific interconnected hardware modules with related control and data signals communicated between and through the modules, or as portions of an application-specific integrated circuit. Thus, the exemplary process flow is applicable to software, firmware, and hardware implementations.

Block 110 entails storing desirable bit segment information using an external tester on to a memory disposed in the packaged component. It can be envisioned that block 110 also includes storing undesirable bit segment information. In some embodiments, the block 110 can further include generating a random bit sequence and then analyzing it to locate the undesirable bit segments that can cause bus contention problems using an external tester. Then a start index, an end index, and a desirable bit segment associated with each of the located undesirable bit segments are obtained and stored onto the memory in the packaged component using the external tester. For a given DUT, the start and end indexes can be obtained by analyzing the random bit sequence applied to the DUT using a sequential logic analysis tool such as a logic simulator or a formal verification tool that identifies states which can cause bus contention. A similar technique can be used to identify bit segments that do not cause bus contention or other electrical problems (desirable bit sequences).

In some embodiments, block 110 also includes further storing on the memory predictable bit segment information using the external tester. Block 110 can also include storing unpredictable bit segment information. Storing the predictable bit segment information can include sequentially analyzing the test result to locate the unpredictable bit segments generated due to X-generation problems in the test result using the external tester. Then a start index, an end index, and a predictable bit segment associated with each of the located unpredictable bit segments are obtained, and stored in the memory using the external tester.

Block 120 generates a random bit sequence including a series of desirable and undesirable bit segments using a random pattern generator disposed in the packaged component for testing the integrated circuit device. For a given test the random bit sequence can include hundreds or thousands of desirable and undesirable bit segments. In some embodiments, the random bit sequence is a pseudo random bit sequence.

Block 130 produces a constrained bit sequence. This is accomplished by removing the undesirable bit segments in the random bit sequence using the stored desirable bit segment information to produce the constrained bit sequence using a programmable constraint correction module disposed in the packaged component. In some embodiments, the constrained bit sequence is produced by sequentially loading the generated random bit sequence on to the integrated circuit device for testing the integrated circuit device. Then the loaded random bit sequence is sequentially monitored for the start index and the end index associated with each of the obtained undesirable bit segments in the loaded random bit sequence. The monitored undesirable bit segments are then sequentially substituted with the desirable bit segments stored in the memory based on the outcome of the monitoring.

Block 140 tests the integrated circuit device by inputting the constrained bit sequence into the integrated circuit device. Next, block 150 outputs the test result. The test result can include hundreds or thousands of predictable and unpredictable bit segments. In some embodiments, outputting the test result can include comparing the received test result to a predetermined test result and determining whether the integrated circuit device is free of structural defects based on the outcome of the comparison.

Next, block 160 removes unpredictable bit segments in the test result using the predictable bit segment information stored in the memory to mask the outcome of the test result to a predictable test result. Unpredictable bits in the test result can be identified by simulating the response of the DUT to the constrained bit sequence applied to it. During such a simulation, storage elements that are not included in the scan chain are initialized to an unknown (X) state at the start of each constrained sequence application. In some embodiments, block 160 outputs the masked test result, and may further include sequentially outputting the test result from the integrated circuit device, and sequentially monitoring the start index and the end index associated with each of the located unpredictable bit segments in the outputted test result, then sequentially substituting the monitored unpredictable bit segments with the predictable bit segments stored in the memory based on the outcome of the monitoring.

Next, block 170 compresses the masked test result to a signature. The signature is then compared with a predetermined test result to determine whether the integrated circuit device is free of structural defects based on an outcome of the comparison. The predetermined test result can include similarly compressed test result.

Figure 2:
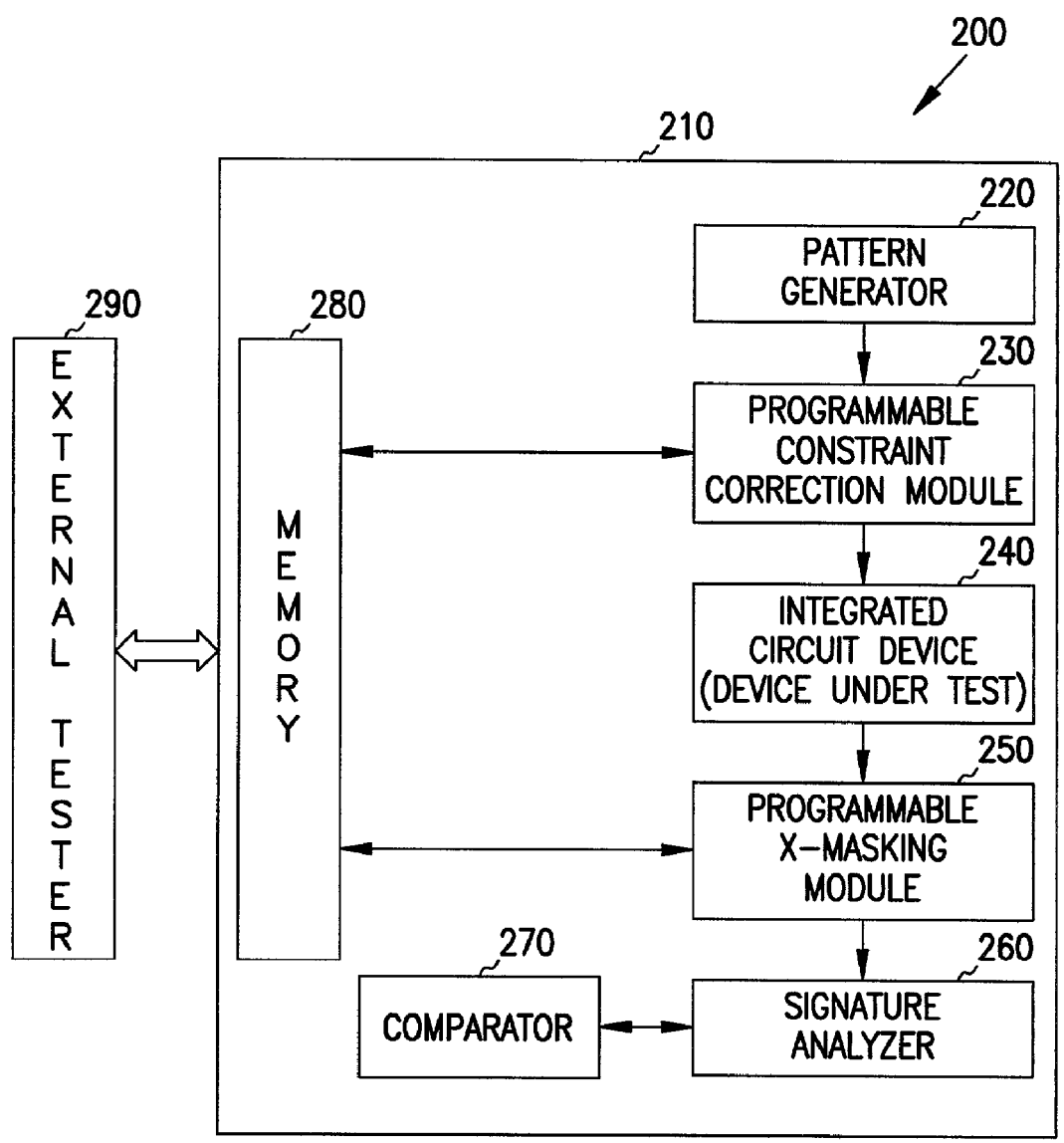
FIG. 2 is a block diagram including components of the embodiment shown in 5 FIG. 1.

FIG. 2 is a block diagram 200, illustrating by way of example, but not by way of limitation, one embodiment of structurally testing an integrated circuit device according to the present invention. The block diagram 200 illustrates a packaged component 210 coupled to an external tester 290. The packaged component includes a pattern generator 220, a programmable constraint correction module 230, an integrated circuit device 240 to be structurally tested, a programmable X-masking module 250, a signature analyzer 260, a comparator 270, and a memory 280. In this embodiment, the constraint correction module 230, the X-masking module 250, and the signature analyzer 260 are programmable logic modules incorporated into the packaged component 210.

In operation, the pattern generator 210 generates random bit sequence including desirable and undesirable bit segments for testing the integrated circuit device. The random bit sequence can includes hundreds and thousands of desirable and undesirable bit segments. The pattern generator can be a pseudo random generator generating a pseudo random bit sequence.

An external tester 290 is loaded with the desirable bit segment information. The memory 280 coupled to the external tester 290 receives and stores the desirable bit segment information from the external tester 290. The memory 280 should be large enough to store the hundreds and thousands of undesirable bit segments.

The programmable constraint correction module 230 is coupled to the pattern generator 220, the integrated circuit device 240, and the memory 280. The programmable constraint correction module 230 receives the random bit sequence generated by the pattern generator 220, and sequentially compares the received random bit sequence including desirable and undesirable bit segments with the stored desirable bit segment information and substitutes the undesirable bit segments in the random bit sequence with the associated stored desirable segments to produce and input constraint bit sequence in to the integrated circuit device 240. Upon receiving the constrained bit sequence the integrated circuit device 240 outputs a test result. The test result can include hundreds and thousands of predictable and unpredictable bit segments. In some embodiments, the external tester 290 further analyzes the test result and generates predictable bit segment information which is stored in the memory 280. The memory 280 should be large enough to store the generated hundreds and/or thousands of unpredictable bit segments. In some embodiments, the packaged component 210 is a microprocessor including a cache memory large enough to store the generated desirable and predictable bit segment information.

The programmable X-masking module 250 coupled to the integrated circuit device 240 and the memory 280 sequentially receive the test result from the integrated circuit device 240 and compares the test result including predictable and unpredictable bit segments with the stored predictable bit segment information, and substitutes the unpredictable bit segments in the test result with the associated stored predictable bit segments based on the outcome of the comparison to produce a masked test result.

The signature analyzer 260 coupled to the X-masking module 250 compresses the masked test result into a signature. The comparator 270 coupled to the signature analyzer 260 compares the signature to a predetermined test result and classifies the integrated circuit device 240 based on the outcome of the comparison.

Figure 3:
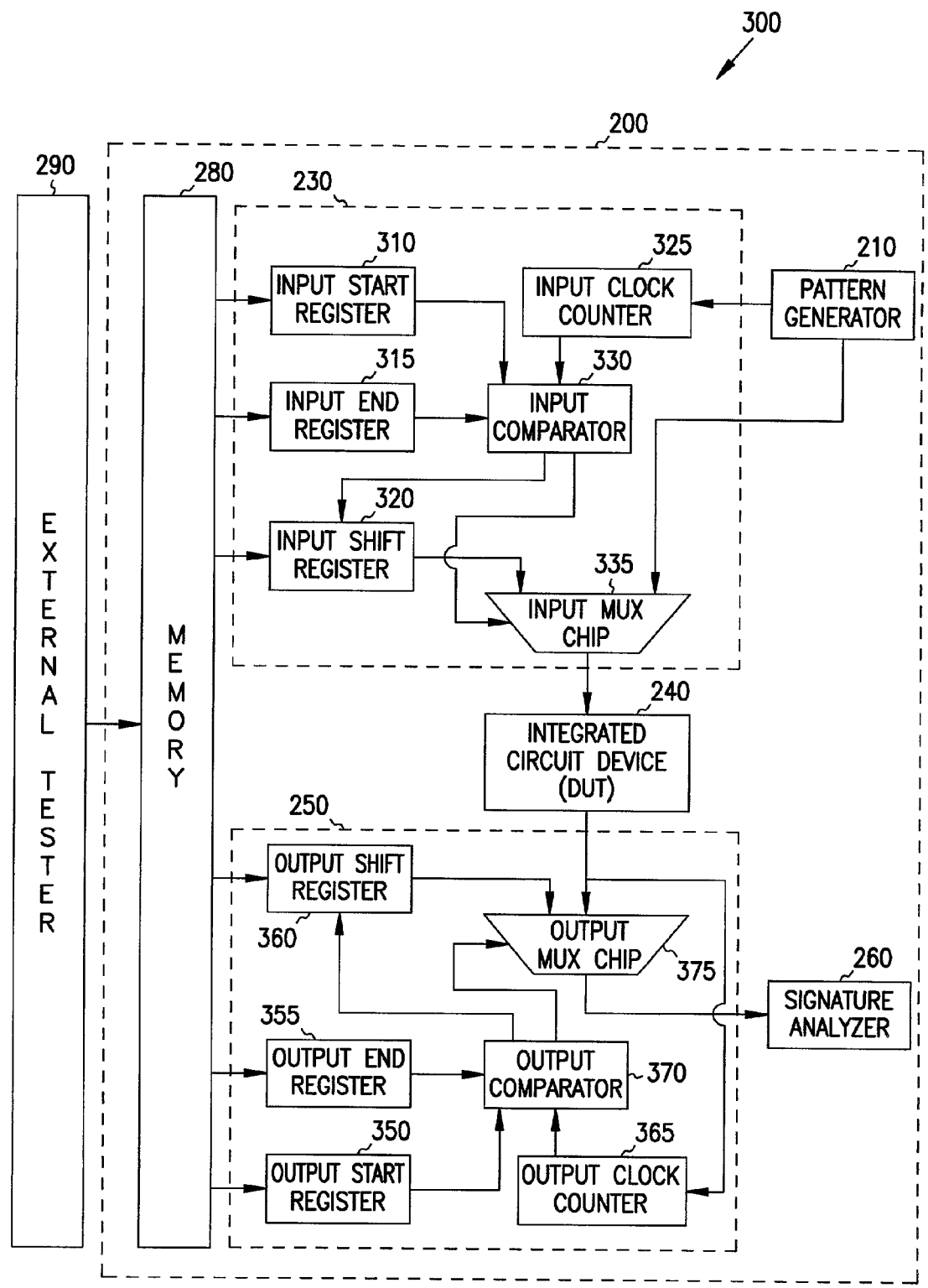
FIG. 3 illustrates major components of constraint correction and X-masking schemes implemented according to the present invention.

FIG. 3 is a block diagram, illustrating by way of example, not by way of limitation, an example embodiment of constraint correction and X-masking modules 300 implemented according to the teaching of the present invention. As shown in FIG. 3, the constrain correction module 230 includes an input start register 310, an input end register 315, an input shift register 320, an input clock counter 325, an input comparator 330, and an input multiplexer 335. Also as shown in FIG. 3, the X-masking module 250 includes an output start register 350, an output end register 355, an output shift register 360, an output clock counter 365, an output comparator 370, and an output multiplexer 375.

The external tester 290 receives a start index, an end index, and a desirable bit segment associated with each of the located undesirable bit segments and stores the received start index, the end index and the desirable bit segment associated with each of the located undesirable bit segments in the memory 280. In some embodiments, the external tester 290 further receives a start index, an end index, and a predictable bit segments associated with each of the located unpredictable bit segments and stores the obtained start index, the end index, and the predictable bit segments associated with each of the located unpredictable bit segments in the memory 280.

In operation, the memory 280 loads the start index, the end index, and the desirable bit segment information associated with the first undesirable bit segment into the input start register 310, input end register 315, and input shift register 320, respectively. The pattern generator 220 loads the generated random bit sequence sequentially into the input multiplexer 335. The input clock counter 325 sequentially updates an input counter value based on the sequential loading of the desirable and undesirable bit segments in the generated random bit sequence. The input comparator 330 does a real-time comparison of the input counter value with the start index stored in the input start register 310 and sends a first input command signal to the input shift register 320 based on the outcome of the comparison. Upon receiving the first input command signal, the input shift register 320 sends the desirable bit segment to the input multiplexer 335. Also, upon sending the first input command signal the input comparator 330 sends an input selection signal to the multiplexer 335 to select the desirable bit segment to be shifted out of the input shift register 320 to overcome the bus contention problems. The input comparator 330 further does a real-time comparison of the input counter value with the end index stored in the input end register 315 and sends a second input command signal to the memory 280 to load a start index, an end index, and a desirable bit segment associated with the second undesirable bit segment into the input start register 310, the input end register 315, and the input shift register 320, respectively. The above described operation repeats itself until all of the undesirable bit segments in the generated random bit sequence are substituted to overcome the bus contention problems. Determination of undesirable/unpredictable segments are done up front during the design phase, generally using logic simulation and formal verification tools.

In some embodiments, the memory 280 loads the start index and the end index associated with a first unpredictable bit segment into the output start register 350, and output end register 355. The integrated circuit device outputs the test result sequentially into the output multiplexer 375. The output clock counter 365 sequentially then updates an output counter value based on the sequential loading of the predictable and unpredictable bit segments in the outputted test result. The output comparator 370 does a real-time comparison of the output counter value with the start index stored in the output start register 350 and sends a first output command signal to the output multiplexer 375. Upon receiving the predictable bit segment, the input multiplexer 375 substitutes the unpredictable bit segment in the test result with the predictable bit segment to overcome the bus contention problems. In some embodiments, the multiplexer 375 substitutes the unpredictable bit segment in the test result with the predictable bit values to perform X-masking. The output comparator 370 further does a real-time comparison of the output counter value with the end index stored in the output end register 355 and sends a second output command signal to the memory 280 to load a start index, and an end index associated with the second unpredictable bit segment into the output start register 350, the output end register 355, and the output shift register 360, respectively. The above described operation repeats itself until all of the unpredictable bit segments in the test result are substituted to overcome the X-generation problems in the outputted test result from the integrated circuit device 240. In some embodiments, the value assigned to the predictable bit segments are zeros. In some embodiments, the X-masking module 250 substitutes the unpredictable bit segments with 1's or 0's as the predictable bit segments without using the output shift register 360.

The above-described test method and apparatus provide among other things, a technique that reduces the bus contention problems and the X-generation problems generally associated with BIST methodology, and yet retains advantages of BIST methodology for structurally testing an integrated circuit device. In one embodiment, this is accomplished by incorporating a pattern generator, a programmable constraint correction module, a programmable X-masking module, and a signature analyzer into the integrated circuit device to eliminate the bus contention problems and the X-generation problems.

It is to be understood that the above description is intended to be illustrative, and not restrictive. Many other embodiments will be apparent to those of skill in the art upon reviewing the above description. The scope of the invention should, therefore, be determined with reference to the following claims, along with the full scope of equivalents to which such claims are entitled.

What is claimed is:

1. A method of structurally testing an integrated circuit device incorporated in a packaged component, comprising:
    storing desirable bit segment information onto a memory disposed in the packaged component;
    generating a random bit sequence including a series of desirable and undesirable bit segments in the packaged component for testing the device;
    removing the undesirable bit segments in the random bit sequence using the stored desirable bit segment information to produce a constrained bit sequence using a programmable constraint correction module disposed in the packaged component; and
    receiving the constrained bit sequence in to the integrated circuit device.

2. The method of claim 1, which further comprises:
    testing the integrated circuit device using the inputted constrained bit sequence; and
    receiving a test result including predictable and unpredictable bit segments.

3. The method of claim 2, which further comprises:
    comparing the received test result to a predetermined test result; and
    determining whether the integrated circuit device is structural defects based on the outcome of the comparison.

4. The method of claim 3, further comprising:
    storing predictable bit segment information onto the memory;
    removing unpredictable bit segments in the test result using the predictable bit segment information stored in the memory to mask the outcome of the test result to a predictable test result; and
    outputting the masked test result.

5. The method of claim 4, further comprising:
    compressing the masked test result to a signature of the test result;
    comparing the signature with a predetermined test result; and
    determining whether the integrated circuit device is free of structural defects based on an outcome of the comparison.

6. The method of claim 4, wherein storing the desirable bit segment information onto the memory further comprises:
    analyzing the generated random bit sequence to locate the undesirable bit segments that can cause bus contention problems using the external tester;
    obtaining a start index, an end index, and a desirable bit segment associated with each of the located undesirable bit segments; and
    storing the obtained start index, end index, and the desirable bit segments associated with each of the located undesirable bit segments on to the memory using the external tester.

7. The method of claim 6, wherein producing the constrained bit sequence further comprises:
    sequentially loading the generated random bit sequence for testing the integrated circuit device;
    sequentially monitoring the loaded random bit sequence for the start index and the end index associated with each of the obtained undesirable bit segments in the loaded random bit sequence; and
    sequentially substituting the monitored undesirable bit segments with the desirable bit segments stored in the memory based on an outcome of the monitoring.

8. The method of claim 7, wherein storing the predictable bit segment information into the memory further comprises:
    sequentially analyzing the test result to locate the unpredictable bit segments generated due to X-generation problems in the test result using the external tester;
    obtaining a start index, an end index, and a predictable bit segment associated with each of the located unpredictable bit segments; and
    storing the obtained start index, the end index and the predictable bit segment information associated with each of the located unpredictable bit segments in to the memory using the external tester.

9. The method of claim 8, wherein masking the outcome of the test result further comprises:
    sequentially outputting the test result from the integrated circuit device;

sequentially monitoring the start index and the end index associated with each of the located unpredictable bit segments in the outputted test result; and sequentially substituting the monitored unpredictable bit segments with the predictable bit segments stored in the memory based on an outcome of the monitoring.

10. The method of claim 1, wherein the packaged component comprises:

a microprocessor including a cache memory.

11. A method of structurally testing an integrated circuit device incorporated in a chip, comprising:

storing desirable bit segment information and predictable bit segment information in a memory incorporated in the chip;

generating sequentially random bit sequence including desirable and undesirable bit segments using a pseudo random pattern generator incorporated in the chip;

comparing sequentially the generated random bit sequence including desirable and undesirable bit segments with the stored desirable bit segment information;

sequentially substituting the undesirable bit segments with associated stored desirable bit segments in the generated random bit sequence to produce a constrained random bit sequence based on an outcome of the comparison;

testing the integrated circuit device by inputting the constrained bit sequence;

sequentially receiving a test result including predictable and unpredictable bit segments;

comparing sequentially the received test result including predictable and unpredictable bit segments with the stored predictable bit segments;

sequentially substituting the unpredictable bit segments with associated stored predictable bit segments to produce a masked test result to produce a predictable test result, based on an outcome of the comparison;

inputting the produced test result into a signature analyzer incorporated in the chip; and compressing the outputted test result to form a signature of the test result.

12. The method of claim 11, further comprising:

generating the desirable and the predictable bit segment information using an external tester.

13. The method of claim 12, wherein generating the desirable and the predictable bit segment information further comprises:

analyzing the generated random bit sequence to locate the undesirable bit segments that can cause bus contention problems using the external tester;

obtaining a start index, an end index, and a desirable bit segment associated with each of the located undesirable bit segments;

analyzing the test result to locate unpredictable bit segments generated due to X-generation problems in the test result using the external tester; and obtaining a start index, an end index, and a predictable bit segment associated with each of the located unpredictable bit segments.

14. The method of claim 13, wherein storing the desirable and predictable bit segment information in the memory further comprises:

storing the obtained start index, end index, and the desirable bit segment information associated with each of the located undesirable and the unpredictable bit segments in the memory using the external tester.

15. The method of claim 14, wherein constraining the generated random bit sequence further comprises:

sequentially loading the generated random bit sequence for testing the integrated circuit device;

sequentially monitoring the loaded random bit sequence for the start index and the end index associated with each of the undesirable bit segments in the loaded random bit sequence; and sequentially substituting the undesirable bit segments with the desirable bit segments stored in the memory based on an outcome of the monitoring.

16. The method of claim 15, wherein masking the outcome of the test result further comprises:

sequentially outputting the test result from the integrated circuit device;

sequentially monitoring the start index and the end index associated with each of the unpredictable bit segments in the outputted test result; and sequentially replacing the unpredictable bit segments with the predictable bit segments stored in the memory based on an outcome of the monitoring.

17. The method of claim 16, further comprising:

comparing the signature to a predetermined test result; and determining whether the integrated circuit device is free of structural defects based on the outcome of the comparison.

18. The method of claim 11, wherein the integrated circuit device on a chip is a microprocessor including an on-chip cache memory.

19. A packaged component, comprising:

an integrated circuit device including circuitry to be structurally tested;

a pattern generator to generate random bit sequence including desirable and undesirable bit segments;

a memory to store the desirable bit segment information; and a programmable constraint correction module, coupled to the random pattern generator, the integrated circuit device, and the memory, to sequentially compare the generated successive random bit sequence including desirable and undesirable bit segments with the stored desirable bit segment information, and to substitute the undesirable bit segments in the random bit sequence with the associated stored desirable segments to produce and input a constrained bit sequence in to the integrated circuit device to output a test result.

20. The packaged component of claim 19, wherein the memory to be coupled to an external tester to receive the desirable bit segment information.

21. The packaged component of claim 19, further comprising:

a programmable X-masking module, coupled to the integrated circuit device and the memory, to sequentially compare the outputted test result including predictable and unpredictable bit segments with the stored predictable bit segment information, and to substitute the unpredictable bit segments in the test result with the associated stored predictable bit segments based on an outcome of the comparison to produce a masked test result.

22. The packaged component of claim 21, further comprising:

a signature analyzer, coupled to the X-masking module, to compress the masked test result into a signature; and a comparator, coupled to the signature analyzer, to compare the signature to a predetermined test result and to classify the integrated circuit device based on the outcome of the comparison.

23. The packaged component of claim 22, wherein the pattern generator, the constraint correction module, the X-masking module, and the signature analyzer are programmable logic modules incorporated in to the packaged component.

24. The packaged component of claim 21, wherein the integrated circuit device is a microprocessor including a cache memory large enough to store the generated desirable and predictable bit segment information.

25. The packaged component of claim 21, wherein the external tester receives a start index, an end index, and a desirable bit segment associated with each of the undesirable bit segments, wherein the external tester further receives a start index, an end index, and a predictable bit segment associated with each of the unpredictable bit segments.

26. The packaged component of claim 25, wherein the memory receives the start index, the end index, and the associated desirable and predictable bit segments from the external tester and stores the received start index, the end index, and the associated desirable and predictable bit segments.

27. The packaged component of claim 26, wherein the constraint correction module further comprises:
   an input start register, an input end register, and an input shift register to receive the stored start index, the end index, and the desirable bit segment associated with a first undesirable bit segment, respectively from the memory;
   an input clock counter to sequentially monitor the random bit sequence for bit segments and update an input counter value;
   an input comparator to compare in real-time the input counter value with the start index stored in the input start register and to send a first input command signal to the input shift register based on an outcome of the comparison; and
   an input multiplexer to sequentially receive the generated random bit sequence including desirable and undesirable bit segments from the pattern generator, wherein the input shift register to send the stored desirable bit segment upon receiving the first input command signal from the input comparator to the input multiplexer, wherein the input comparator to send an input select signal to the multiplexer upon sending the first command signal to the input shift register, wherein the input multiplexer to substitute the first undesirable bit segment with the stored desirable bit segment to produce a constrained bit segment to overcome the bus contention problems, and wherein the input comparator to further compare the input counter value to the stored end index in the input end register and to send a second input command signal to the memory to load the start index, the end index, and the desirable bit segment associated with a second undesirable bit segment into the input start register, input end register, and the input shift register, respectively.

28. The packaged component of claim 27, wherein the X-masking module further comprises:
   an output start register, an output end register, and an output shift register to receive the stored start index, the end index, and the predictable bit segment associated with a first unpredictable bit segment, respectively from the memory;
   an output clock counter to sequentially monitor the test result for bit segments and update an output counter value;
   an output comparator to compare in real-time the output counter value with the start index stored in the output start register and to send a first output command signal to the output shift register; and
   an output multiplexer to sequentially receive the generated test result including predictable and unpredictable bit segments from the integrated circuit device, wherein the output shift register to send the desirable bit segment upon receiving the first output command signal from the output comparator to the output multiplexer, and wherein the output multiplexer to substitute the first unpredictable bit segment with the stored predictable bit segment to mask the test result to overcome X-generation problems and to produce a predictable test result, and wherein the output comparator to further compare the output counter value to the stored end index in the output end register and to send a second output command signal to the memory to load the start index and the end index associated with a second unpredictable bit segment into the output start register, the output end register, and the output shift register, respectively.

29. The packaged component of claim 28, wherein constraining the undesirable bit segments and the masking of the unpredictable bit segments continues sequentially until all of the stored undesirable and unpredictable bit segments are substituted with desirable and predictable bit segments.

* * * * *